(12) United States Patent
Ono et al.

(10) Patent No.: US 11,274,367 B2
(45) Date of Patent: Mar. 15, 2022

(54) VAPORIZER

(71) Applicant: LINTEC CO., LTD., Shiga (JP)

(72) Inventors: Hirofumi Ono, Shiga (JP); Shigeo Yagi, Shiga (JP); Kenta Yamamoto, Shiga (JP)

(73) Assignee: LINTEC CO., LTD., Shiga (JP)

( * ) Notice: Subject to any disclaimer, the term of this patent is extended or adjusted under 35 U.S.C. 154(b) by 0 days.

(21) Appl. No.: 17/058,616

(22) PCT Filed: Apr. 22, 2019

(86) PCT No.: PCT/JP2019/016959
§ 371 (c)(1),
(2) Date: Nov. 24, 2020

(87) PCT Pub. No.: WO2020/021796
PCT Pub. Date: Jan. 30, 2020

(65) Prior Publication Data
US 2021/0207266 A1 Jul. 8, 2021

(30) Foreign Application Priority Data

Jul. 24, 2018 (JP) .............................. JP2018-138837
Apr. 12, 2019 (JP) .............................. JP2019-076185

(51) Int. Cl.
*C23C 16/44* (2006.01)
*C23C 16/448* (2006.01)
(Continued)

(52) U.S. Cl.
CPC .......... *C23C 16/4483* (2013.01); *B01B 1/005* (2013.01); *B01J 7/02* (2013.01); *B05B 1/24* (2013.01)

(58) Field of Classification Search
CPC . C23C 16/4483; C23C 16/4485; B01B 1/005; B01J 7/02; B01J 7/00; B05B 1/24
See application file for complete search history.

(56) References Cited

U.S. PATENT DOCUMENTS

| 7,332,040 B1 | 2/2008 | Kojima et al. |
| 8,162,298 B2 * | 4/2012 | Ono .................... C23C 16/4486 261/154 |

(Continued)

FOREIGN PATENT DOCUMENTS

| CN | 102060268 A | 5/2011 |
| JP | H04-45838 A | 2/1992 |

(Continued)

OTHER PUBLICATIONS

"Porous Metal Design Guidebook" published Sep. 9, 2016 accessed at <https://web.archive.org/web/20160909063109/https://mottcorp.com/sites/default/files/Porous%20Metal%20Design%20Guidebook%20Published%20by%20MPIF.pdf> (Year: 2016).*

(Continued)

*Primary Examiner* — Stephen Hobson
(74) *Attorney, Agent, or Firm* — Lucas & Mercanti, LLP

(57) ABSTRACT

Provided is a vaporizer capable of reducing the occurrence of bumping in a vaporization space and thereby minimizing the pressure fluctuations therein, when a method not using an atomizer is employed. A vaporizer (1) includes a tank body (10), a porous member (30) disposed in the vaporizer (1) and heated, a supply tube (40) configured to supply a liquid material (L) to the porous member (30), and a gas discharge passage (7) configured to discharge a source gas (G) produced by vaporizing the liquid material (L) to the outside. An outlet (41) of the supply tube (40) is disposed in contact with or in close proximity to the porous member (30). When the outlet (41) is disposed in close proximity to the porous member (30), a separation distance (H) between the outlet (41) and the porous member (30) is not greater than a distance from the outlet (41) to a bottom of a droplet of the liquid material (L) formed and suspended at the outlet (41) by surface tension.

6 Claims, 7 Drawing Sheets

(51) Int. Cl.
 B01B 1/00 (2006.01)
 B01J 7/02 (2006.01)
 B05B 1/24 (2006.01)

(56) References Cited

U.S. PATENT DOCUMENTS

| | | | | |
|---|---|---|---|---|
| 8,628,621 | B2* | 1/2014 | Lee | C23C 14/26 |
| | | | | 118/724 |
| 9,005,365 | B2* | 4/2015 | Bulovic | C23C 16/04 |
| | | | | 118/726 |
| 9,079,146 | B2* | 7/2015 | Wallace | H01M 8/0606 |
| 9,816,715 | B2* | 11/2017 | Morikawa | F24F 1/0073 |
| 9,942,946 | B2* | 4/2018 | Long | C23C 14/12 |
| 9,957,612 | B2* | 5/2018 | Woelk | B01D 1/14 |
| 2011/0259972 | A1* | 10/2011 | Rosenthal | A61M 15/06 |
| | | | | 239/13 |
| 2012/0111554 | A1* | 5/2012 | Wilson | F24F 6/02 |
| | | | | 165/229 |
| 2013/0011308 | A1* | 1/2013 | Tiwari | C10J 3/485 |
| | | | | 422/207 |
| 2016/0007410 | A1* | 1/2016 | Long | C23C 14/26 |
| | | | | 219/539 |
| 2018/0148836 | A1* | 5/2018 | Long | C23C 14/12 |

FOREIGN PATENT DOCUMENTS

| | | |
|---|---|---|
| JP | H05-28960 U | 4/1993 |
| JP | H06-300197 A | 10/1994 |
| JP | H10-85581 A | 4/1998 |
| JP | 2001-239151 A | 9/2001 |
| JP | 3650543 B2 | 5/2005 |
| JP | 2007-100207 A | 4/2007 |
| JP | 2008-538158 A | 10/2008 |
| JP | 2009147356 A | 7/2009 |
| JP | 4601535 B2 | 12/2010 |
| JP | 2011156485 A | 8/2011 |
| TW | 200932368 A | 8/2009 |
| WO | 2013/094680 A1 | 6/2013 |

OTHER PUBLICATIONS

KIPO, Office Action for the corresponding Korean Patent Application No. 10-2020-7034727, dated Jan. 27, 2021, with English translation.
PCT, International Search Report for the corresponding patent application No. PCT/JP2019/016959, dated Jul. 2, 2019, with English translation.
JPO, Notice of Reasons for Refusal for the Japanese application No. 2019-076185, dated Sep. 10, 2019, with English translation.
JPO, Notice of Reasons for Refusal for the Japanese application No. 2019-076185, dated Jan. 14, 2020, with English translation.
Office Action for the corresponding Chinese Patent Application No. 201980035271.1, dated May 26, 2021 and an English translation thereof.

\* cited by examiner

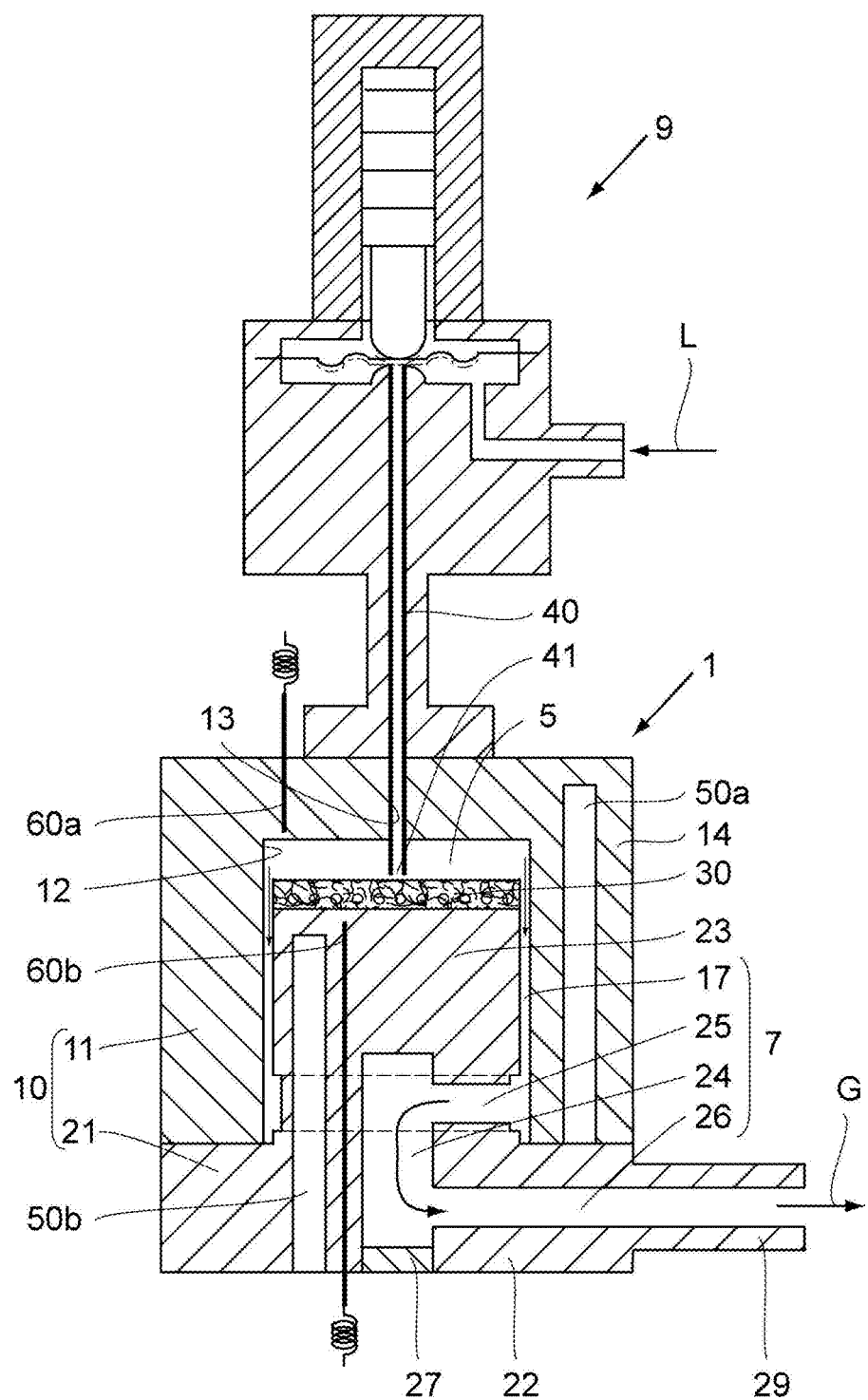
[FIG. 1]

[FIG. 2]
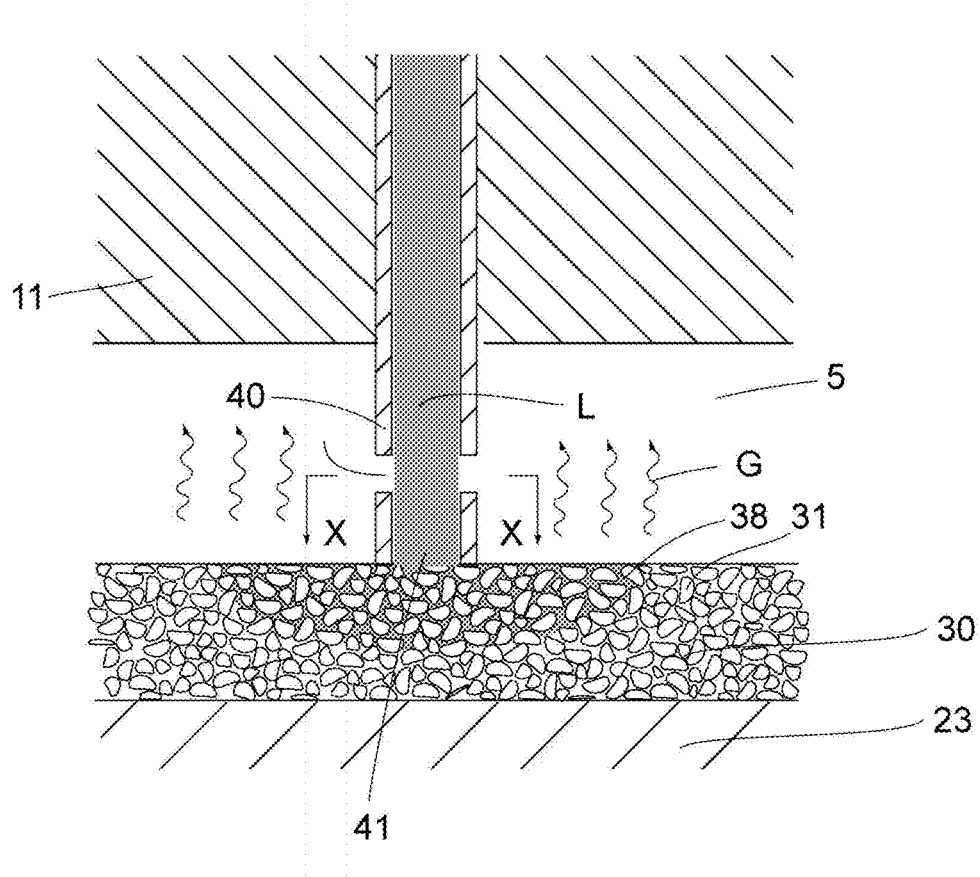
[FIG. 3]
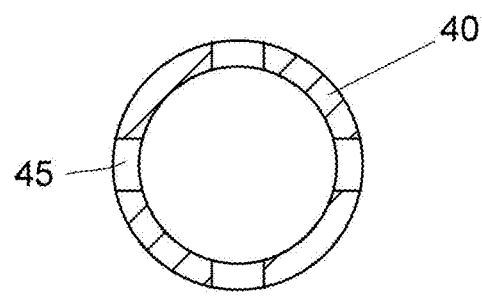

[FIG. 4]
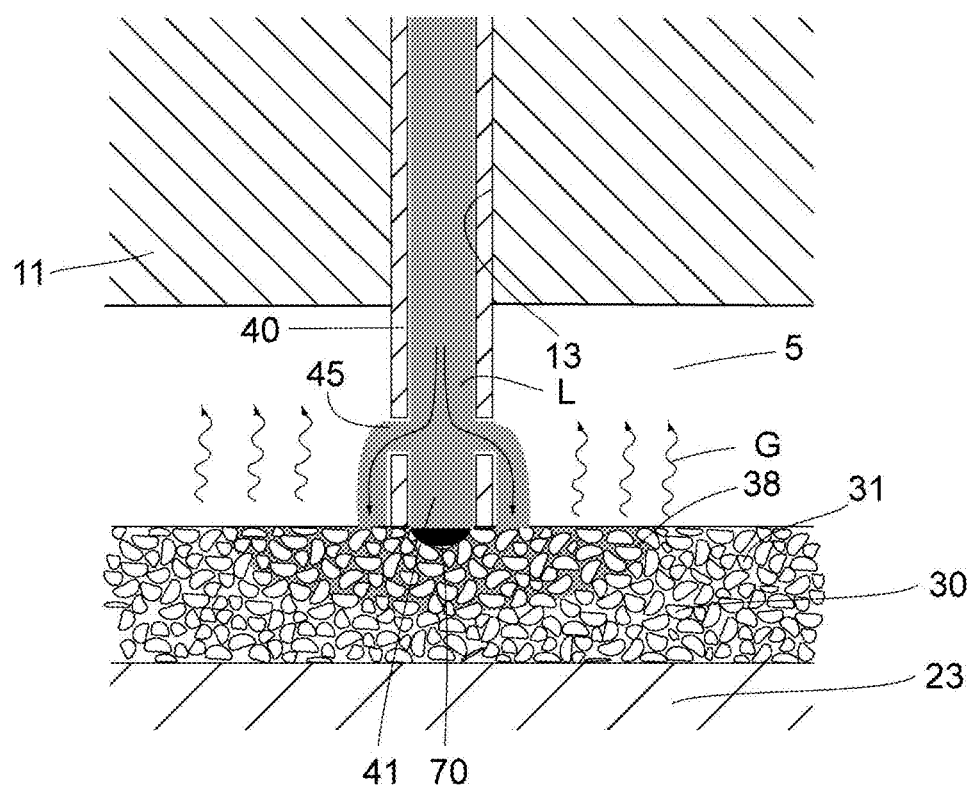

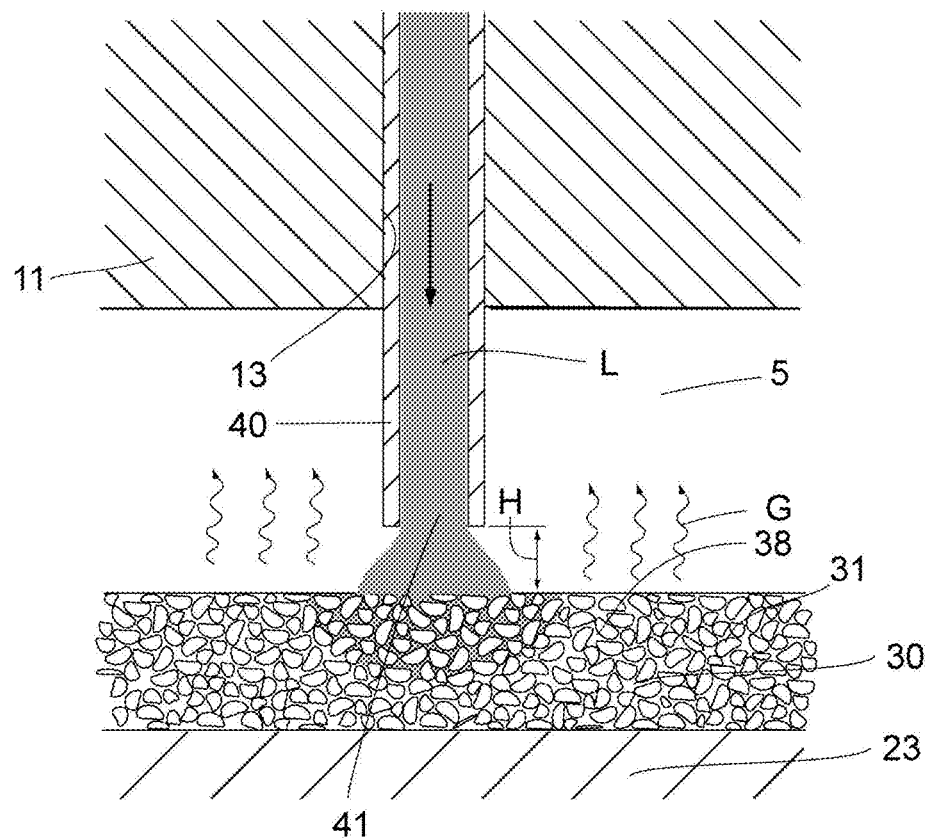
[FIG. 5]

[FIG. 8]
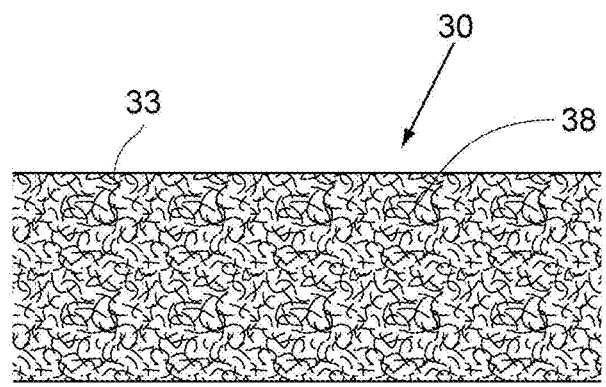
[FIG. 9]
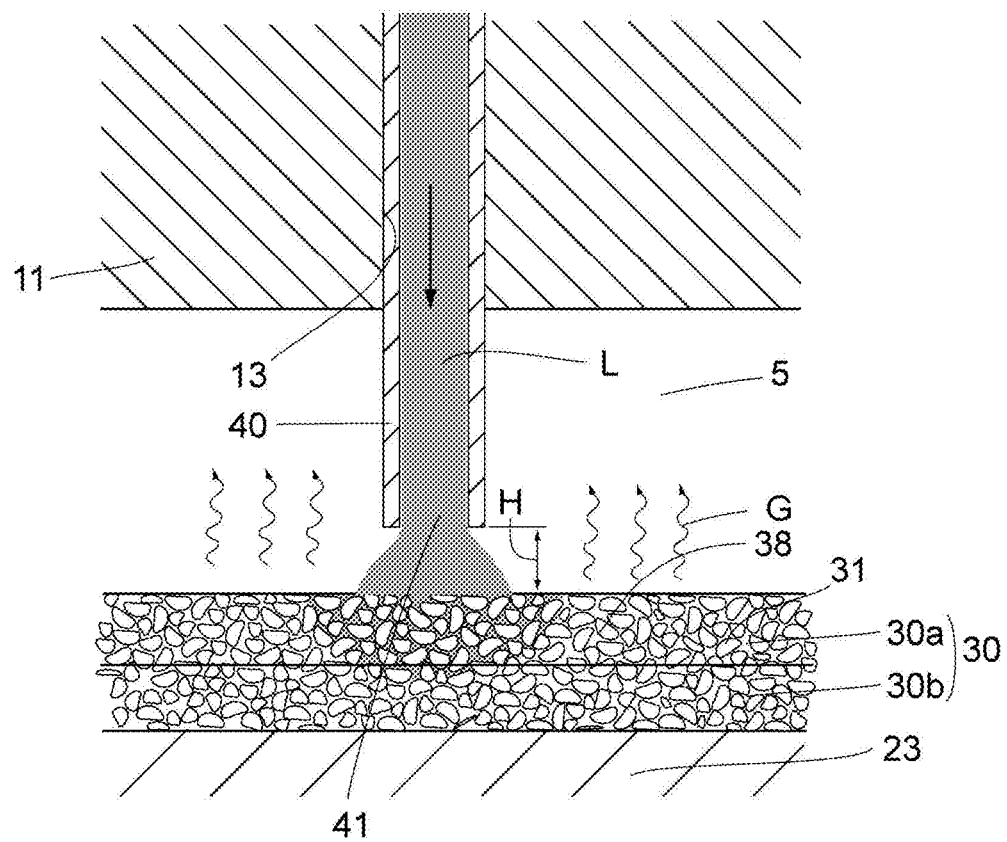

VAPORIZER

CROSS REFERENCE TO RELATED APPLICATION

This Application is a 371 of PCT/JP2019/016959 filed on Apr. 22, 2019, which in turn claims priority of Japanese patent application no. 2018-138837, filed on Jul. 24, 2018, and 2019-076185, filed on Apr. 12, 2019, the above applications are incorporated herein by reference.

TECHNICAL FIELD

The present invention relates to a vaporizer for vaporizing a liquid material without using an atomizing carrier gas for atomizing the liquid material to be vaporized, and more particularly to a vaporizer in which a supply tube (a capillary tube) for introducing the liquid material into the vaporizer is disposed in contact with or in close proximity to a porous member (a sintered filter) to minimize pressure fluctuations in the course of vaporization.

BACKGROUND ART

A semiconductor device fabrication process includes various steps such as deposition (film formation), etching, and diffusion. Gases are used as source materials in most of these steps. In recent years, however, most of the gaseous materials have been replaced by liquid materials.

A liquid material is converted into a gas by a vaporizer and then subjected to a reaction step. In the case of a gaseous material, its flow rate is very stable because it is controlled by a mass flow controller.

On the other hand, in the case of a liquid material, it is introduced into the vaporizer at a controlled flow rate, atomized into a mist by an atomizing gas in the vaporizer, and then the mist is vaporized by heating. In this case, the pressure fluctuates more widely than in the case of the gaseous material. In order to produce uniform films stably, these pressure fluctuations must be reduced as much as possible.

In the state-of-the-art semiconductor deposition processes, the use of carrier gases has decreased. In a vaporization step performed without using such an atomizing gas or a carrier gas, the pressure fluctuates much more widely than in the case where an atomizing gas or a carrier gas is used, for the reasons described below.

CITATION LIST

Patent Literature

[PTL 1] Japanese Patent No. 3650543
[PTL 2] Japanese Patent No. 4601535

SUMMARY OF INVENTION

Technical Problem

As a conventional method for vaporizing a liquid material efficiently and stably, the liquid material is atomized into a mist using an atomizer and then the mist is introduced into a vaporization chamber, as described above. With this method, the vaporization is performed stably and the pressure fluctuations in the vaporization chamber can be reduced.

However, in a state-of-the-art method, a liquid material is not atomized using an atomizer but is dropped through a narrow supply tube and the resulting large droplets are introduced directly into the vaporization chamber. The droplets thus introduced hit the heated inner wall of the vaporization chamber one after another and are vaporized instantaneously. As a result, bumping occurs in succession on the inner wall of the vaporization chamber and the pressure in the vaporizer (the internal pressure of the vaporization chamber) fluctuates widely. These fluctuations cause the uneven concentration of the source gas to be supplied to a film forming apparatus. This uneven concentration of the source gas, which is fatal to the film forming apparatus, prevents uniform deposition in the apparatus. This is a serious problem in the vaporization step performed without using an atomizer.

The present invention has been made in view of the above conventional problem, and its object is to provide a vaporizer capable of reducing the occurrence of bumping which occurs when a liquid material comes in contact with a heated surface and thereby minimizing the pressure fluctuations in the vaporizer, when a method not using an atomizer is employed.

Solution to Problem

One embodiment of the invention is a vaporizer 1 including:
a tank body 10 having a vaporization space 5 therein;
a porous member 30 disposed in the vaporization space 5 and heated;
a supply tube 40 inserted into the vaporization space 5 from outside and configured to supply a liquid material L to the porous member 30; and
a gas discharge passage 7 configured to discharge, from the vaporization space 5 to the outside, a source gas G produced by vaporizing the liquid material L through the porous member 30.

In this vaporizer 1, an outlet 41 of the supply tube 40 is disposed in contact with the porous member 30, and
the supply tube 40 is provided with a micro through-hole 45 on a side wall thereof near the outlet 41.

Another embodiment of the invention is the vaporizer 1, wherein the porous member 30 has a recess 34 formed on a top surface thereof to allow the outlet 41 of the supply tube 40 to be inserted into the recess 34.

Another embodiment of the invention is the vaporizer 1, wherein the porous member 30 is made of a sintered metal, a ceramic, a sintered metal mesh laminate, or a sintered metal fiber fabric.

Another embodiment of the invention is the vaporizer 1, wherein the porous member 30 is formed of a stack of two or more porous plates 30a and 30b.

Another embodiment of the invention is the vaporizer 1, wherein the porous member 30 is formed of a stack of two or more porous plates 30a and 30b, a porous plate 30a located closer to the outlet 41 of the supply tube 40 is provided with a through-hole 34a serving as the recess 34, and a porous plate 30b located farther from the outlet 41 is a flat plate.

Another embodiment of the invention is a vaporizer 1 including:
a tank body 10 having a vaporization space 5 therein;
a porous member 30 disposed in the vaporization space 5 and heated;

a supply tube 40 inserted into the vaporization space 5 from outside and configured to supply a liquid material L to the porous member 30; and a gas discharge passage 7 configured to discharge, from the vaporization space 5 to the outside, a source gas G produced by vaporizing the liquid material L through the porous member 30.

In this vaporizer 1, an outlet 41 of the supply tube 40 is disposed in contact with the porous member 30, and an edge of the outlet 41 of the supply tube 40 is cut to form a notch 48 near the outlet 41.

Advantageous Effects of the Invention

In the vaporizer 1 of the present invention, the outlet 41 of the supply tube 40 is disposed in contact with the porous member 30 or in close proximity to the porous member 30 at a separation distance H within the range as described above. Therefore, upon contact with the porous member 30, the liquid material L discharged through the outlet 41 penetrates into the porous member 30 before evaporating and then rapidly spreads in all directions from a point corresponding to the outlet 41.

The liquid material L evaporates gradually and continuously from an area of the surface of the porous member 30 around the point corresponding to the outlet 41 of the supply tube 40. As a result, the pressure fluctuations in the vaporizer 1 is significantly reduced.

BRIEF DESCRIPTION OF DRAWINGS

FIG. 1 is a vertical sectional view of a vaporizer of the present invention and a liquid flow control valve connected to the vaporizer.

FIG. 2 is a vertical sectional view of a state in which a supply tube is in contact with a porous member of the present invention.

FIG. 3 is a cross-sectional view taken along the line X-X of FIG. 2.

FIG. 4 is a vertical sectional view of a state in which the outlet of the supply tube in the state of FIG. 2 is clogged but a liquid material is flowing out of the supply tube through micro through-holes thereof.

FIG. 5 is a vertical sectional view of a state in which the supply tube is separated from the porous member of the present invention.

FIG. 8 is a vertical sectional view of the porous member of the present invention that is made of a sintered non-woven metal fiber fabric.

FIG. 9 is a vertical sectional view of a state in which the porous member of the present invention is composed of two or more porous plates.

DESCRIPTION OF EMBODIMENTS

Figure 6A:
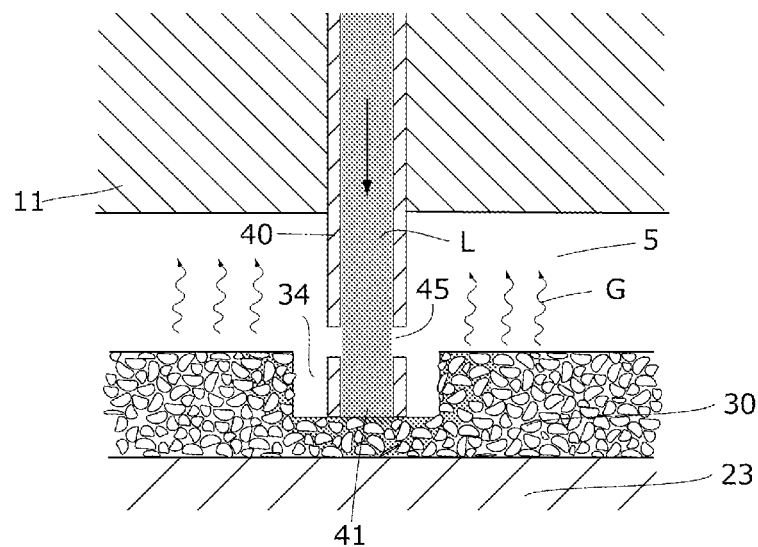
FIG. 6A is a vertical sectional view of a state in which the supply tube having micro through-holes is inserted into a recess of the porous member of the present invention.

Hereinafter, the present invention will be described with reference to the drawings. FIG. 1 is a vertical sectional view of a vaporizer 1 of the present invention. The vaporizer 1 includes a tank body 10, a porous member 30, a supply tube 40, heaters 50a and 50b, and thermocouples 60a and 60b.

The tank body 10 includes an outer block 11 and an inner block 21, which are made of a corrosion-resistant material resistant to a liquid material L. The outer block 11 has a bottom-open storage space 12 formed therein and an insertion hole 13 extending from its top surface to the ceiling surface of the storage space 12. One or a plurality of heaters 50a are embedded in the side wall 14 of the outer block 11 that surrounds the storage space 12 to heat the outer block 11 to a predetermined temperature. A thermocouple 60a for measuring the temperature of the outer block 11 is embedded in the ceiling wall of the outer block 11. The thermocouple 60a is inserted into the ceiling wall so that the tip thereof is located in close proximity to the ceiling surface to accurately measure the temperature of a vaporization space 5 in contact with that ceiling surface.

The inner block 21 includes a base portion 22 and a stand portion 23 mounted in the center of the top surface of the base portion 22. One or a plurality of heaters 50b are embedded in the inner block 21 from the bottom of the inner block 21 to the vicinity of the top surface of the stand portion 23.

A space, which is formed between the top surface of the stand portion 23 and the ceiling surface of the storage space 12 of the outer block 11, is referred to as a vaporization space 5. An annular gap, which is formed between the inner circumferential surface of the storage space 12 and the outer circumferential surface of the stand portion 23, is referred to as a gas discharge gap 17 serving as a portion of a gas discharge passage 7.

A bottom-open central cavity 24 extending from the bottom of the inner block 21 upward into the stand portion 23 is formed in the inner block 21. The bottom of the central cavity 24 is closed by a lid member 27. A gas inlet hole 25 is formed in the side surface of the upper end portion of the central cavity 24 to communicate with the gas discharge gap 17, and a gas outlet hole 26 is formed in the side surface of the central cavity 24 near its bottom and connected to the tip of a gas discharge nozzle 29 formed in the side surface of the base portion 22. The gas discharge gap 17, the gas inlet hole 25, the central cavity 24, and the gas outlet hole 26 form the gas discharge passage 7. In this case, a thermocouple 60b is inserted from the bottom of the inner block 21 to the vicinity of the top surface of the stand portion 23 so as to measure the temperature in the vicinity of the top surface of the stand portion 23 and thereby detect the temperature in the vaporization space 5.

In the case where only the heater 50a in the outer block 11 can maintain the vaporization space 5 at a temperature suitable for vaporization, the heater 50b in the inner block 21 is omitted. On the other hand, in the case where only the heater 50b in the inner block 21 can maintain the vaporization space 5 at a temperature suitable for vaporization, the heater 50a in the outer block 11 is omitted.

The porous member 30 is a thick disk-shaped member. Examples of the material suitable for the porous member 30 include sintered particles 31 of alloys such as highly corrosion-resistant stainless steels, Hastelloys, and Permalloys, sintered particles 31 of other metals such as copper, aluminum, and iron, for certain types of the liquid material L, and even sintered particles 31 of ceramics.

Pores (voids) 38 formed between the particles 31 of the porous member 30 communicate with each other (a so-called "open-cell" member), and numerous pores open to the surface of the porous member 30 (and further to the inner circumferential surface and bottom surface of a recess 34 to be described later). The thickness of the porous member 30 is smaller than the height of the vaporization space 5 (i.e., the height from the stand portion 23 to the ceiling surface of the storage space 12). The maximum size of the porous member 30 is equal to the size of the top surface of the stand portion 23 to cover the entire top surface thereof. The size of the porous member 30 may be smaller than the size of the top surface of the stand portion 23 as long as the vaporization of the liquid material L penetrated into the porous member 30 is not inhibited.

Figure 7:
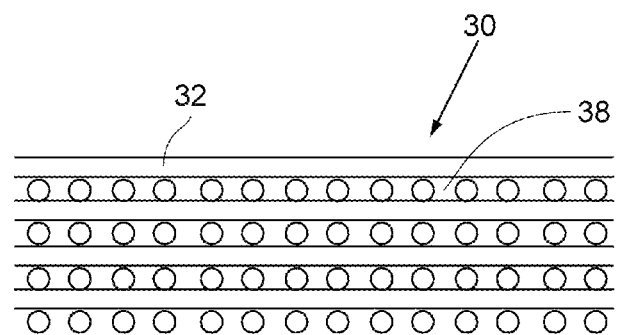
FIG. 7 is a vertical sectional view of the porous member of the present invention that is made of a sintered metal mesh laminate.

Other examples of the material suitable for the porous member 30 include a sintered metal mesh laminate 32 having high corrosion resistance and chemical resistance, as shown in FIG. 7, and a thick sintered non-woven metal fiber fabric 33 having high corrosion resistance and chemical resistance, as shown in FIG. 8. The height and area of these materials are the same as those of the above-mentioned sintered particles 31. The voids in the metal mesh or the fiber serve as the pores 38, into which the liquid material L penetrates.

Figure 6B:
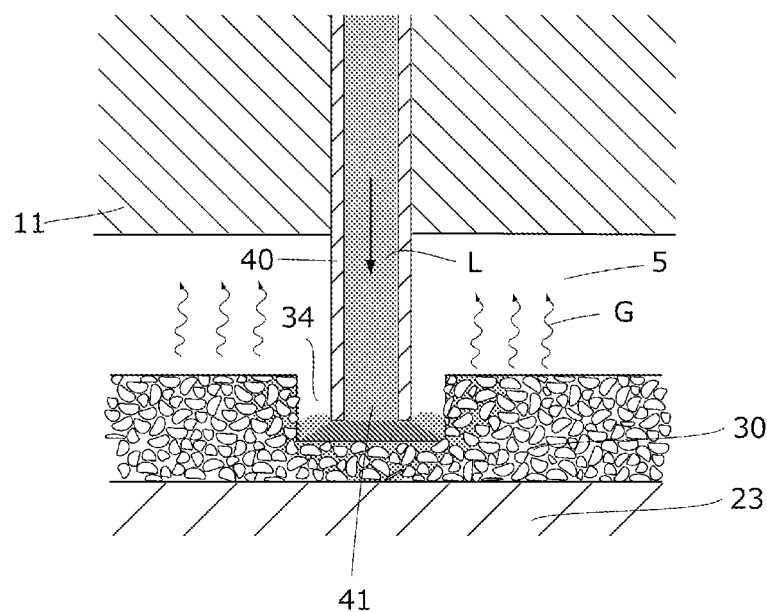
FIG. 6B is a vertical sectional view of a state in which the supply tube having no micro through-holes is inserted into a recess of the porous member of the present invention.

In a modification of the shape of the porous member 30, a recess 34 is formed in the center of the top surface of the porous member 30, as shown in FIGS. 6A and 6B. The outlet 41 as the lower end of the supply tube 40 to be described later is inserted into the recess 34. Numerous pores 38 open to the inner circumferential surface and bottom surface of the recess 34, as described above. This recess 34 can also be formed in the sintered metal mesh laminate 32 or the thick sintered non-woven metal fiber fabric 33. This porous member 30 is fixed to the top surface of the stand portion 23 of the inner block 21.

FIG. 9 shows another example where the porous member 30 is formed of a stack of two or more porous plates 30a and 30b. Two plates are stacked in FIG. 9, but the number of plates is not limited to two, and three or more plates may be stacked. The porous plates 30a and 30b may have the same porosity. Alternatively, the porosity of the top layer (i.e., the porous plate 30a located closest to the supply tube 40) may be higher (i.e., sparser) and the porosity of the lower porous plate(s) 30b may be lower (i.e., denser) than that of the top porous plate 30a. For that purpose, the (above-mentioned) materials of the porous plates 30a and 30b may be different from each other.

The top porous plate 30a is more likely to clog than the lower porous plate(s) 30b. Therefore, only the top porous plate 30a can be replaced by a new one, if it clogs.

Figure 10A:
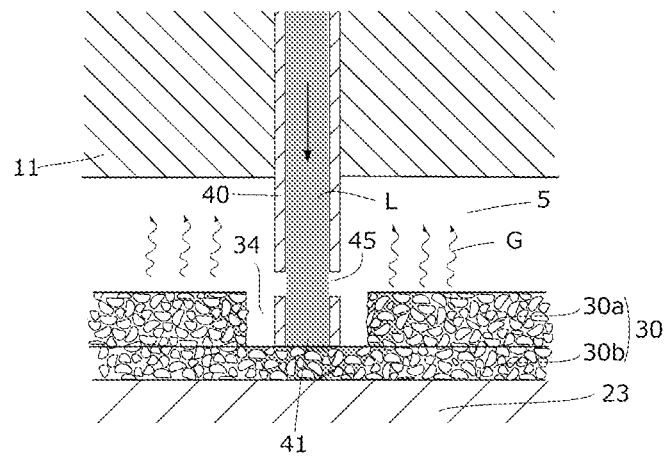
FIG. 10A is a vertical sectional view of a state in which the porous member of the present invention is composed of two or more porous plates and the top porous plate is provided with a through-hole, and the supply tube having micro through-holes is inserted into a recess of the porous member.
Figure 10B:
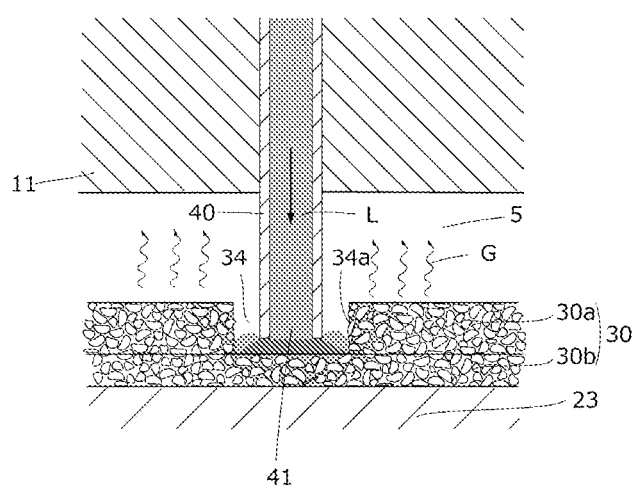
FIG. 10B is a vertical sectional view of a state in which the porous member of the present invention is composed of two or more porous plates and the top porous plate is provided with a through-hole, and the supply tube having no micro through-holes is inserted into a recess of the porous member.

FIGS. 10A and 10B are modifications of FIGS. 6A and 6B. In this modification, the upper porous plate(s) 30a (located closer to the outlet 41 of the supply tube 40) is provided with a through-hole 34a serving as the recess 34 while the lower porous plate(s) 30b (located farther from the outlet 41) is a flat plate, and the porous member 30 may be disposed such that the recess 34 as shown in FIGS. 6A and 6B is located directly below the outlet 41 of the supply tube 40.

The supply tube 40 is a capillary tube leading from a device like, for example, a liquid flow control valve 9, and is configured to supply the liquid material L from above the vaporizer 1 to the downstream vaporizer 1 at a predetermined mass flow rate. In FIG. 1, the supply tube 40 is a single component but may be composed of two or more components connected together. Like the porous member 30, this supply tube 40 is also made of a highly corrosion-resistant and chemical-resistant material.

This supply tube 40 may be a single capillary tube in its entirety, or may be provided with micro through-holes 45 on the side wall of its tip, as shown in FIG. 2 and FIG. 3. Therefore, there are two types of supply tubes 40: one having the micro through-holes 45 as described above; and the other having no micro through-holes 45. In these figures, four micro through-holes 45 are provided.

The supply tube 40 is disposed in such a manner that the outlet 41 of the supply tube 40 at its tip is in contact with the surface of the porous member 30, as shown in FIG. 2, or the outlet 41 is located at a small separation distance H from the surface of the porous member 30, as shown in FIG. 5. These two arrangements are selectively used depending on the properties of the liquid material L, as a general rule. When the liquid material L is susceptible to thermal decomposition and thus likely to form a deposit 70 of a reaction product, the supply tube 40 is disposed at a small separation distance H from the porous member 30. When the liquid material L is less susceptible to thermal decomposition, the supply tube 40 is disposed in contact with the porous member 30.

The separation distance H is usually about 0.5 mm to 1.0 mm. The maximum separation distance H is a distance from the outlet 41 to the bottom of a droplet of the liquid material L formed and suspended at the outlet 41. If the separation distance H is too large, the droplet of the liquid material L suspended at the outlet of the supply tube 40 detaches from the outlet 41, transforms into a spherical shape, and then hits the top surface of the porous member 30. Upon collision between the droplet and the top surface, bumping occurs and the pressure in the vaporization space 5 fluctuates greatly. The maximum separation distance H is determined to prevent this pressure fluctuations. More specifically, when the separation distance H is equal to the length of the droplet of the liquid material L, the droplet of the liquid material L suspended at the outlet 41 comes into contact with the surface of the porous member 30 before it detaches from the outlet 41, and upon contact with the porous member 30, the liquid material L penetrates into the porous member 30. Thus, bumping as described above is prevented.

Figure 11:
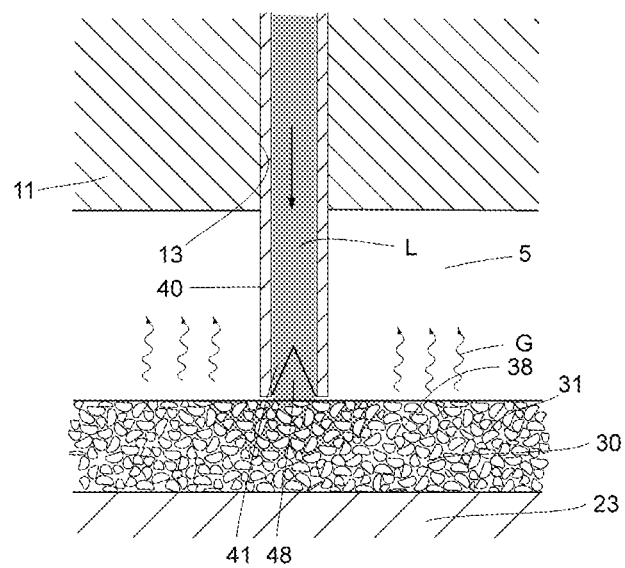
FIG. 11 is a vertical sectional view of a state in which the supply tube of the present invention is provided with a notch at an end portion of the outlet.

FIG. 11 shows another example of the supply tube 40. The edge of the outlet 41 of the supply tube 40 is cut (to a depth of 1 mm to 5 mm from the edge) so as to form one or more notches 48 near the outlet 41. In a front view, each of the notches 48 may have a triangular shape whose width gradually increases toward the edge, as shown in FIG. 11, or may be a slit with a fixed width.

Next, an operation example of the vaporizer 1 of the present invention will be described. When the heater 50a for the outer block 11 of the vaporizer 1 is turned on, the outer block 11 is heated to a predetermined temperature. The temperature is controlled by the thermocouple 60a mounted in the outer block 11 by feedback control. Thereby, the interior of the vaporization space 5 is maintained at a temperature suitable for vaporization and thus the porous member 30 is also maintained at that temperature.

In the case of FIG. 2, the supply tube 40 is provided with the micro through-holes 45 in its tip portion, and in the case of FIG. 11, the supply tube 40 is provided with the notches 48 therein. In both cases, the outlet 41 of the supply tube 40 is in contact with the top surface of the porous member 30. A material which is less likely to produce a reaction product when heated is selected as the liquid material L.

In this state, when the liquid material L is supplied through the supply tube 40 toward the porous member 30 at a mass flow rate controlled by the liquid flow control valve 9, the liquid material L that has reached the outlet 41 of the supply tube 40 does not vaporize but instantaneously penetrates into the pores 38 of the porous member 30 through its surface and rapidly spreads around in the porous member 30.

The porous member 30 is fixed to the top surface of the stand portion 23 of the inner block 21 and maintained at a predetermined temperature, as described above. Therefore, the liquid material L that has penetrated into the porous member 30 is heated in the porous member 30. The heated liquid material L is vaporized successively and steadily, without any bumping, through the pores 38 exposed to the surface of the porous member 30 around the supply tube 40. As a result, the pressure fluctuations in the vaporization space 5 are reduced to a very low level and stable vaporization is performed. The source gas G thus vaporized is delivered to the next step through the gas discharge passage 7 composed of the gas discharge gap 17 between the outer block 11 and the inner block 21, the gas inlet hole 25, the central cavity 24, and the gas outlet hole 26. Thus, high-precision deposition can be achieved.

In the above case, only the heater 50a of the outer block 11 is used. However, in the case where the amount of the liquid material L to be supplied is larger than that the heater 50a can heat or the liquid material L is less likely to vaporize due to its properties, the heater 50b of the inner block 21 is additionally used. Since the porous member 30 is fixed to the top surface of the stand portion 23 of the inner block 21, when the heater 50b of the inner block 21 is turned on, its heat is transferred to the porous member 30.

It should be understood that since the heaters 50a and 50b are thermally controlled by the thermocouples 60a and 60b, both the heaters 50a and 50b may be used in combination even in the above first case.

When vaporization continues for a long time, even if the liquid material L is less likely to produce a reaction product, the reaction product may be deposited at the outlet 41 of the supply tube 40 and eventually clog the outlet 41. In this case, the liquid material L is forced out of the supply tube 40 through the micro through-holes 45 on the side surface near the outlet 41, steadily flows down the outer surface of the supply tube 40, and penetrates into the porous member 30 upon contact therewith. Thus, with the use of the supply tube provided with the micro through-holes 45 near its outlet, even if the outlet 41 is clogged, vaporization operation can be continued without interruption.

The notch 48 shown in FIG. 11 has the same function as the micro through-hole 45. Even if a reaction product is deposited at the outlet 41, the liquid material L steadily flows down through the opening of the notch 48 located above the height of the deposit of the reaction product, and penetrates into the porous member 30 upon contact therewith.

In contrast, FIG. 5 shows the case where the outlet 41 of the supply tube 40 is disposed at a distance from the surface of the porous member 30. Even a liquid material L which is more likely to produce a reaction product can be used in this case.

In this case, even if the reaction product is gradually deposited in the pores 38 of the porous member 30 and on the porous member 30 up to the level of the outlet 41 of the supply tube 40, a space large enough for the liquid material L to flow through is provided between the deposit 70 and the outlet 41 of the supply tube 40, and therefore vaporization operation can be continued without interruption. The flowing liquid material L is absorbed into the porous member 30 before being vaporized and then vaporized from the porous member 30 in a steady manner, as in the case of the supply tube 40 located at no distance from the porous member 30.

Here, the separation distance H between the outlet of the supply tube 40 and the porous member 30 is described. When the separation distance H between the outlet of the supply tube 40 and the porous member 30 is too large, the liquid material L flowing from the outlet 41 is pulled into a spherical shape by surface tension and the resulting droplets drop onto the surface of the porous member 30. Upon hitting the surface of the porous member 30, the droplets are vaporized instantaneously and cause bumping, resulting in great pressure fluctuations in the vaporization space 5. Therefore, the separation distance H is an important factor in achieving the steady vaporization operation.

The separation distance H is usually determined in a range of 0.5 mm to 1.0 mm. The separation distance H is at most the distance from the outlet 41 to the bottom of the droplet suspended at the outlet 41. The value of this distance depends on the surface tension of the liquid material L, but a value less than the value of this distance can be selected. A value in the above-mentioned range is selected in practice. In this sense, the values mentioned above are significant in the present invention.

In this case, when the porous plate 30a as the top layer (or the porous plates 30a as the upper layers including the top layer) is sparser than the porous plate(s) 30b as the lower layer(s), the liquid material L penetrates into the porous plate 30a as the top layer (or the porous plates 30a as the upper layers including the top layer) at a higher rate. As a result, the occurrence of bumping can be further reduced.

FIGS. 6A and 6B respectively show a case where a recess 34 is provided in the center of the top surface of the porous member 30 and the supply tube 40 having the micro through-holes 45 is inserted into the recess 34 in such a manner that the outlet 41 of the supply tube 40 is in contact with the bottom surface of the recess 34, and a case where the supply tube 40 having no micro through-holes 45 is inserted into the recess 34 in such a manner that the outlet 41 is located at a separation distance H in the above-mentioned range from the bottom surface of the recess 34. In this case, another effect can be obtained in addition to the above-described effects. Since the liquid material L is collected in the recess 34, it penetrates into the porous member 30 not only through the bottom surface of the recess 34 but also through the inner side surface thereof. This means that the penetration area increases. As a result, the penetration rate of the liquid material L into the porous member 30 is higher than that in the case where the recess 34 is not provided. All the features except the recess 34 are the same as those of the above embodiment.

In an example of this case, when the porous member 30 is composed of two or more porous plates 30a and 30b, the porous plate(s) 30a provided with a through-hole 34a serving as the recess 34 and the flat porous plate 30b as the top layer of the flat porous plates 30b without a through-hole 34a serving as the recess 34 may be made of a sparse material as described above while the lower flat porous plate(s) 30b may be made of a denser material as described above. In this example, the liquid material L penetrates into the sparser layers at a higher rate, and the occurrence of bumping can be further reduced, as in the case described above.

REFERENCE SIGNS LIST

1: Vaporizer
5: Vaporization space
7: Gas discharge passage
9: Liquid flow control valve
10: Tank body
11: Outer block
12: Storage space
13: Insertion hole
14: Side wall
17: Gas discharge gap
21: Inner block
22: Base portion
23: Stand portion
24: Central cavity
25: Gas inlet hole
26: Gas outlet hole
27: Lid member
29: Gas discharge nozzle
30: Porous member
30a, 30b: Porous plates
31: Particles
32: Sintered metal mesh laminate
33: Thick sintered non-woven metal fiber fabric
34: Recess
34a: Through-hole
38: Pore
40: Supply tube
41: Outlet
45: Micro through-hole
48: Notch
50a, 50b: Heaters
60a, 60b: Thermocouples
70: Deposit
G: Source gas
H: Separation distance
L: Liquid material

The invention claimed is:

1. A vaporizer comprising:
a tank body having a vaporization space therein;
a porous member disposed in the vaporization space and heated;
a supply tube inserted into the vaporization space from outside and configured to supply a liquid material to the porous member; and
a gas discharge passage configured to discharge, from the vaporization space to the outside, a source gas produced by vaporizing the liquid material through the porous member, wherein
an outlet of the supply tube is disposed in contact with the porous member, and
the supply tube is provided with a micro through-hole on a side wall thereof near the outlet, and the micro through-hole penetrates through the supply tube from an inner circumferential surface to an outer circumferential surface of the supply tube.

2. The vaporizer according to claim 1, wherein the porous member has a recess formed on a top surface thereof to allow the outlet of the supply tube to be inserted into the recess.

3. The vaporizer according to claim 1, wherein the porous member is made of any one of a sintered metal, a ceramic, a sintered metal mesh laminate, and a sintered metal fiber fabric.

4. The vaporizer according to claim 1, wherein the porous member is formed of a stack of two or more porous plates.

5. The vaporizer according to claim 2, wherein the porous member is formed of a stack of two or more porous plates, a porous plate located closer to the outlet of the supply tube is provided with a through-hole serving as the recess, and a porous plate located farther from the outlet is a flat plate.

6. The vaporizer according to claim 2, wherein the porous member is made of any one of a sintered metal, a ceramic, a sintered metal mesh laminate, and a sintered metal fiber fabric.

* * * * *